(12) United States Patent
Happ et al.

(10) Patent No.: US 7,593,255 B2
(45) Date of Patent: Sep. 22, 2009

(54) INTEGRATED CIRCUIT FOR PROGRAMMING A MEMORY ELEMENT

(75) Inventors: Thomas Happ, Dresden (DE); Thomas Nirschl, Munich (DE); Jan Boris Philipp, Munich (DE)

(73) Assignees: Qimonda North America Corp., Cary, NC (US); Infineon Technologies AG, Neubiberg (DE)

( * ) Notice: Subject to any disclaimer, the term of this patent is extended or adjusted under 35 U.S.C. 154(b) by 41 days.

(21) Appl. No.: 11/952,462

(22) Filed: Dec. 7, 2007

(65) Prior Publication Data

US 2009/0147563 A1   Jun. 11, 2009

(51) Int. Cl.
*G11C 7/00* (2006.01)

(52) U.S. Cl. .................... 365/163; 365/148
(58) Field of Classification Search ............ 365/163, 365/148
See application file for complete search history.

(56) References Cited

U.S. PATENT DOCUMENTS

| | | | |
|---|---|---|---|
| 6,075,719 A | 6/2000 | Lowrey et al. | |
| 6,687,153 B2 | 2/2004 | Lowrey | |
| 6,759,267 B2 | 7/2004 | Chen | |
| 6,831,872 B2 * | 12/2004 | Matsuoka | 365/210.12 |
| 7,006,371 B2 * | 2/2006 | Matsuoka | 365/148 |
| 7,099,180 B1 | 8/2006 | Dodge et al. | |
| 2004/0246804 A1 | 12/2004 | Cho et al. | |
| 2004/0246808 A1 | 12/2004 | Cho et al. | |
| 2005/0117387 A1 | 6/2005 | Hwang et al. | |
| 2005/0117388 A1 | 6/2005 | Cho et al. | |
| 2005/0169095 A1 * | 8/2005 | Bedeschi et al. | 365/232 |
| 2006/0126380 A1 | 6/2006 | Osada et al. | |
| 2006/0280010 A1 * | 12/2006 | Hanzawa et al. | 365/203 |
| 2007/0077699 A1 | 4/2007 | Gordon et al. | |
| 2007/0206410 A1 | 9/2007 | Sutardja | |
| 2008/0123389 A1 * | 5/2008 | Cho et al. | 365/148 |

OTHER PUBLICATIONS

"A Nonvolatile Programmable Solid Electrolyte Nanometer Switch", T. Sakamoto, et al., ISSCC 2004 (10 pgs.), Jun. 2004.
"Enhanced Write Performance of a 64Mb Phase-change Random Access Memory", Hyung-rok, et al., ISSCC.2005 (3 pgs.), Feb. 2005.
"Intel StrataFlash Memory Technology Overview", Greg Atwood, et al., Intel Technology Journal Q4'97 (8 pgs.), Oct. 1997.
"Ovonic Unified Memory", Ovonyx Non-Confidential, Dec. 1999 (80 pgs.).

\* cited by examiner

*Primary Examiner*—Michael T Tran
(74) *Attorney, Agent, or Firm*—Dicke, Billig & Czaja, PLLC

(57) ABSTRACT

An integrated circuit includes a resistance changing memory element and a circuit. The circuit is configured to program the memory element by iteratively applying a variable program pulse to the memory element until a resistance of the memory element crosses a first reference resistance. The variable program pulse is adjusted for each iteration such that the resistance of the memory element approaches the first reference resistance.

22 Claims, 8 Drawing Sheets

US 7,593,255 B2

INTEGRATED CIRCUIT FOR PROGRAMMING A MEMORY ELEMENT

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on.

To program a phase change memory cell to an intermediate resistance value, the amount of crystalline material coexisting with amorphous material and hence the cell resistance is controlled via a suitable write strategy. The amount of crystalline material coexisting with amorphous material should be precisely controlled to ensure consistent resistance values for multi-bit storage. Consistent resistance values having a narrow distribution of the different resistance levels ensure that a sufficient sensing margin can be obtained.

For these and other reasons, there is a need for the present invention.

SUMMARY

One embodiment provides an integrated circuit. The integrated circuit includes a resistance changing memory element and a circuit. The circuit is configured to program the memory element by iteratively applying a variable program pulse to the memory element until a resistance of the memory element crosses a first reference resistance. The variable program pulse is adjusted for each iteration such that the resistance of the memory element approaches the first reference resistance.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
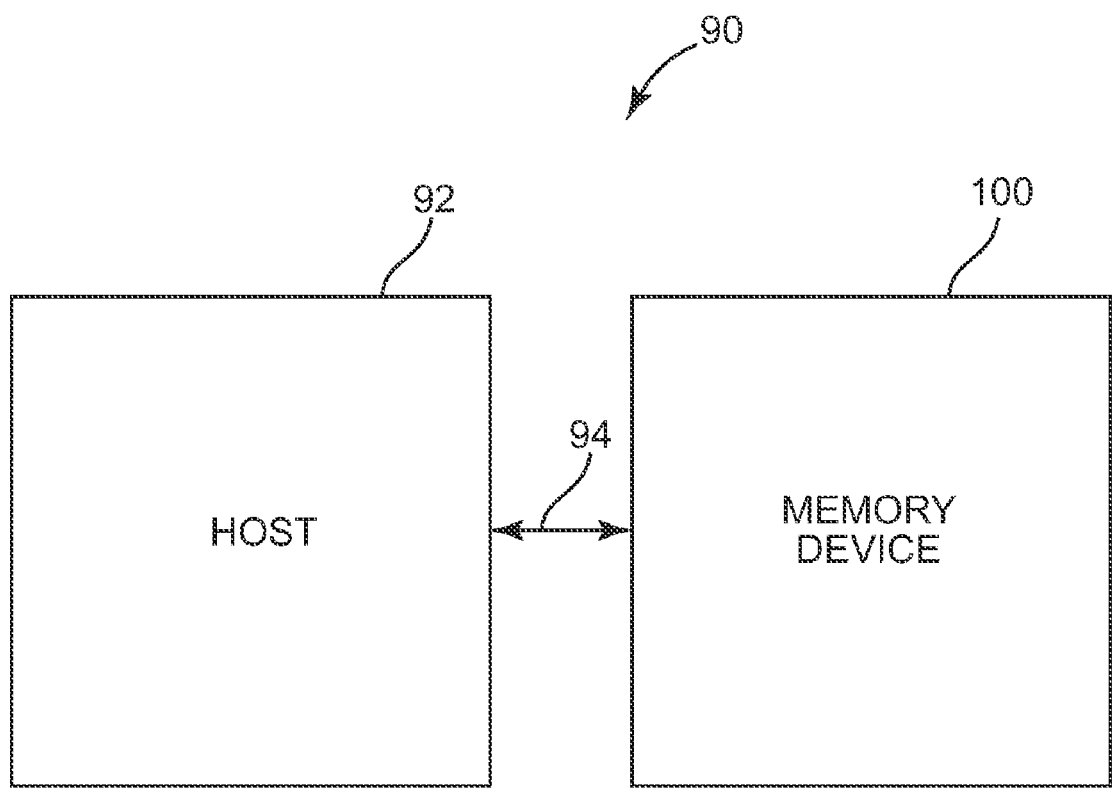
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
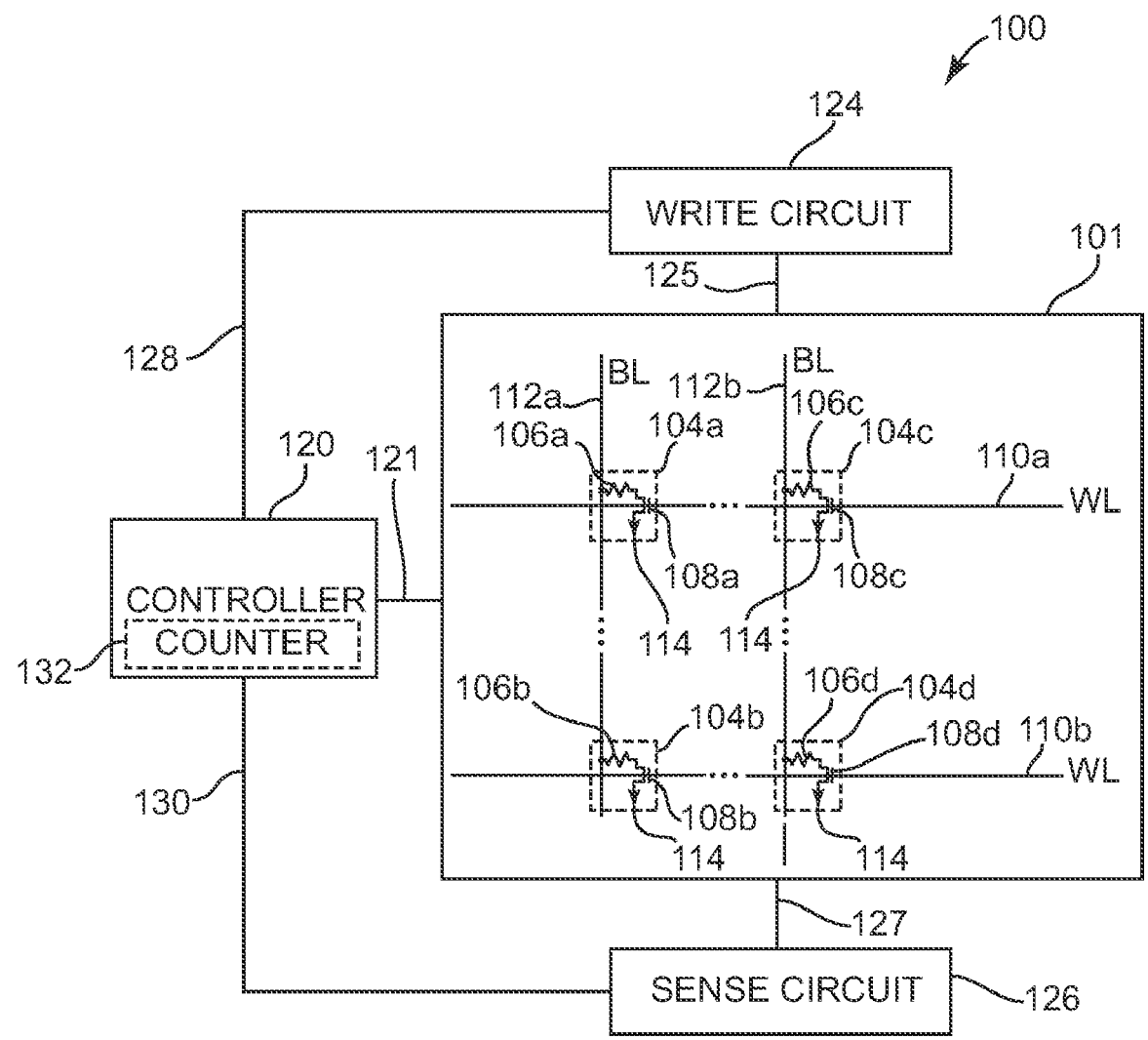
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 101, and a sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

A selected memory cell 104 is programmed to a desired intermediate resistance state by using an iterative process. The iterative process includes applying variable program pulses to the selected memory cell until the resistance of the selected memory cell crosses a reference resistance. A parameter or parameters of the variable program pulse are adjusted for each iteration. The parameter or parameters are adjusted such that the resistance of the selected memory cell gradually approaches the reference resistance. Once the resistance of the selected memory cell crosses the reference resistance, the selected memory cell is programmed to the desired intermediate resistance state.

In one embodiment, the variable program pulses include partial set pulses. In one embodiment, the initial partial set pulse is preceded by a fixed reset pulse. In another embodiment, each partial set pulse is preceded by the fixed reset pulse. In another embodiment, the variable program pulses include partial reset pulses. In this embodiment, each partial reset pulse is optionally preceded by the fixed reset pulse. The reset and/or variable program pulses are applied to the selected memory cell until the resistance of the selected memory cell reaches the desired resistance state or until a maximum number of iterations is exceeded. If the maximum number of iterations is exceeded, the selected memory cell is considered to be defective and programming of the selected memory cell is terminated.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode or diode-like structure is used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

In one embodiment, each phase change element 106 includes a phase change material that may be made up of a variety of materials. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, controller 120 includes a counter 132. Counter 132 counts the number of iterations used to program a memory cell 104. If the number of iterations reaches a predetermined value, the memory cell being programmed is considered to be defective and the programming is terminated.

In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a write operation of phase change memory cell 104a, word line 110a is selected to activate transistor 108a. With word line 110a selected, a reset current or voltage pulse is selectively enabled by write circuit 124 and sent through bit line 112a to phase change element 106a thereby heating phase change element 106a above its melting temperature. After the current or voltage pulse is turned off, phase change element 106a quickly quench cools into its substantially amorphous and highest resistance state. A variable programming current or voltage pulse is then selectively enabled by write circuit 124 and sent through bit line 112a to phase change element 106a thereby heating phase change element 106a. The programming pulse includes a partial set pulse or a partial reset pulse to change the resistance of phase change element 106a.

The resistance of phase change element 106a is then read to determine whether the resistance has crossed a desired reference resistance. If the resistance of phase change element 106a has crossed the desired reference resistance, programming of phase change element 106a is complete. If the resistance of phase change element 106a has not crossed the desired reference resistance, one or more additional reset pulses and/or modified programming pulses are selectively enabled by write circuit 124 and sent through bit line 112a to phase change element 106a. Each additional programming pulse is adjusted from the previous programming pulse such that the resistance of phase change element 106a gradually approaches the desired reference resistance.

The process is repeated until the resistance of phase change element 106a crosses the desired reference resistance or until counter 132 reaches a predetermined value. In this way, phase change element 106a is programmed to an amorphous state, crystalline state, or partially crystalline and partially amorphous state during this write operation. Phase change memory cells 104b-104d and other phase change memory cells 104 in memory array 101 are programmed similarly to phase change memory cell 104a using similar current or voltage pulses.

Figure 3:
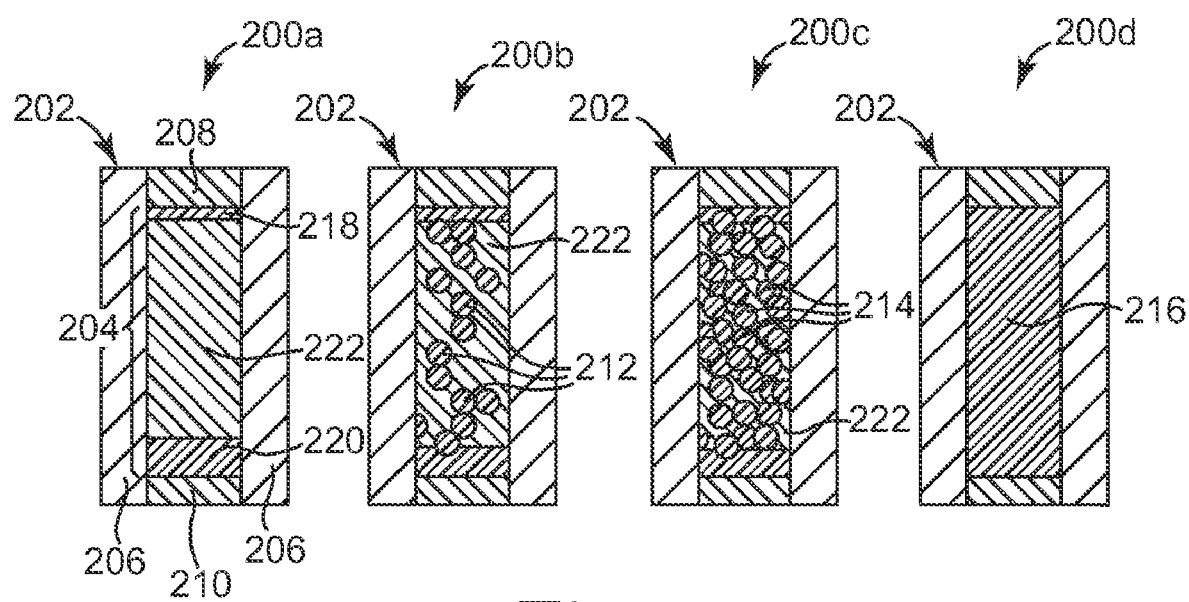
FIG. 3 is a diagram illustrating one embodiment of a phase change element in four different states.

FIG. 3 is a diagram illustrating one embodiment of a phase change element 202 in four different states at 200a, 200b, 200c, and 200d. Phase change element 202 includes a phase change material 204 that is laterally surrounded by insulation material 206. In other embodiments, phase change element 202 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to phase change element 202 via first electrode 208 and second electrode 210. The current path through phase change material 204 is from one of the first electrode 208 and second electrode 210 to the other one of the first electrode 208 and second electrode 210. In one embodiment, each of the phase change elements 106a-106d is similar to phase change element 202. Phase change element 202 provides a storage location for storing bits of data.

Insulation material 206 can be any suitable insulator, such as $SiO_2$, $SiO_x$, SiN, fluorinated silica glass (FSG), boro-phosphorous silicate glass (BPSG), or boro-silicate glass (BSG). First electrode 208 and second electrode 210 can be any suitable electrode material, such as TiN, TaN, W, WN, Al, C, Ti, Ta, TiSiN, TaSiN, TiAlN, TaAlN, or Cu.

Phase change material 204 is programmed into one of four states to store two bits of data. A selection device, such as an active device like a transistor 108 (FIG. 2) or diode, is coupled to first electrode 208 to control the application of pulses to phase change material 204. The pulses melt phase change material 204 and program one of the four states into phase change material 204. At 200a, a large fraction 222 of phase change material 204 has been programmed to change the resistance through phase change material 204 and phase change element 202. At 200b, a small fraction 212 of phase change material 204 has been programmed to change the resistance through phase change material 204 and phase change element 202. At 200c, a medium sized fraction 214 of phase change material 204 has been programmed to change the resistance through phase change material 204 and phase change element 202. At 200d, a large fraction 216, which is substantially all of phase change material 204, has been programmed to change the resistance through phase change material 204 and phase change element 202.

The size and state of the programmed fraction is related to the resistance through phase change material 204 and phase change element 202. The four different phase change fractions at 200a-200d provide four states in phase change material 204, and phase change element 202 provides a storage location for storing two bits of data. In one embodiment, the state of phase change element 202 at 200a is a "00", the state of phase change element 202 at 200b is a "01", the state of phase change element 202 at 200c is a "10", and the state of phase change element 202 at 200d is a "11". In another embodiment, the state of phase change element 202 at 200a is a "11", the state of phase change element 202 at 200b is a "10", the state of phase change element 202 at 200c is a "01", and the state of phase change element 202 at 200d is a "00".

At 200a, phase change material 204 is programmed to a substantially amorphous state. During a write operation of phase change element 202, a write pulse is selectively enabled by the selection device and sent through first electrode 208 and phase change material 204. The write pulse heats phase change material 204 above its melting temperature and phase change material 204 is quickly cooled to achieve the substantially amorphous state at 200a. After the write operation, phase change material 204 includes crystalline state phase change material at 218 and 220, and amorphous state phase change material at 222. The substantially amorphous state at 200a is the highest resistance state of phase change element 202.

To program phase change material 204 into one of the other three states 200b-200d, a first fixed pulse (i.e., a reset pulse) resets phase change element 202 to the substantially amorphous state and a second variable pulse (i.e., a programming pulse) programs phase change element 202 to the desired resistance state. In one embodiment, the first fixed pulse is optional if the second variable pulse includes a partial reset pulse. The pulses are iteratively applied until the resistance of phase change element 202 crosses a reference resistance for the desired resistance state.

At 200b, reset and programming pulses are provided to program the small volume fraction 212 into a crystalline state. The crystalline state is less resistive than the amorphous state and phase change element 202 at 200b has a lower resistance than phase change element 202 in the substantially amorphous state at 200a. The partially crystalline and partially amorphous state at 200b is the second highest resistance state of phase change element 202.

At 200c, reset and programming pulses are provided to program the medium volume fraction 214 into a crystalline state. Since the crystalline fraction 214 is larger than the crystalline faction 212 and the crystalline state is less resistive than the amorphous state, phase change element 202 at 200c has a lower resistance than phase change element 202 at 200b and phase change element 202 in the substantially amorphous state at 200a. The partially crystalline and partially amorphous state at 200c is the second lowest resistance state of phase change element 202.

At 200d, reset and programming pulses are provided to program substantially all of the phase change material 216 into the crystalline state. Since the crystalline state is less resistive than the amorphous state, phase change element 202 at 200d has a lower resistance than phase change element 202 at 200c, phase change element 202 at 200b, and phase change element 202 in the substantially amorphous state at 200a. The substantially crystalline state at 200d is the lowest resistance state of phase change element 202. In other embodiments, phase change element 202 can be programmed into any suitable number of resistance values or states.

Figure 4:
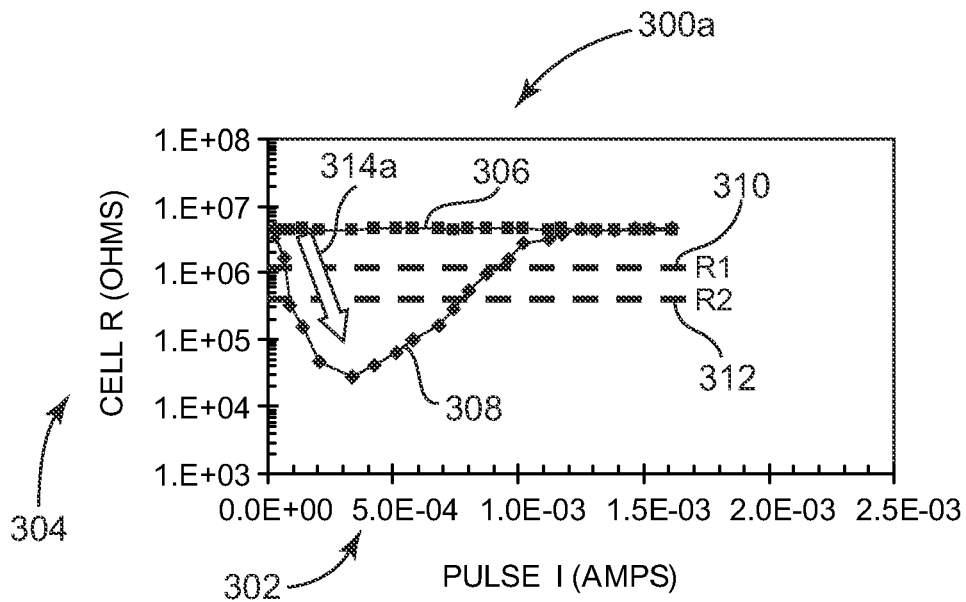
FIG. 4 is a graph illustrating one embodiment of resistance versus pulse current for programming a phase change element.

FIG. 4 is a graph 300a illustrating one embodiment of resistance versus pulse current for programming a phase change element. Graph 300a includes pulse current in amps on x-axis 302 and cell resistance in ohms on y-axis 304. The resistance values for optimized or fixed reset pulses are indicated by line 306 and the resistance values for variable program pulses are indicated by curve 308.

An optimized reset pulse resets the phase change element to the substantially amorphous state (i.e., the highest resistance state) as illustrated at 200a in FIG. 3. In one embodiment, the variable program pulse includes a set pulse that sets the phase change element to the substantially crystalline state (i.e., the lowest resistance state) as illustrated at 200d in FIG. 3. In another embodiment, the variable program pulse includes a partial set pulse that sets the phase change element to an intermediate resistance state, such as illustrated at 200b and 200c in FIG. 3. The partial set pulse and the resulting resistance is represented by the left side of the U-shaped curve 308. In another embodiment, the variable program pulse includes a partial reset pulse that resets the phase change element to an intermediate resistance state, such as illustrated at 200b or 200c in FIG. 3. The partial reset pulse and the resulting resistance is represented by the right side of the U-shaped curve 308.

Figure 5:
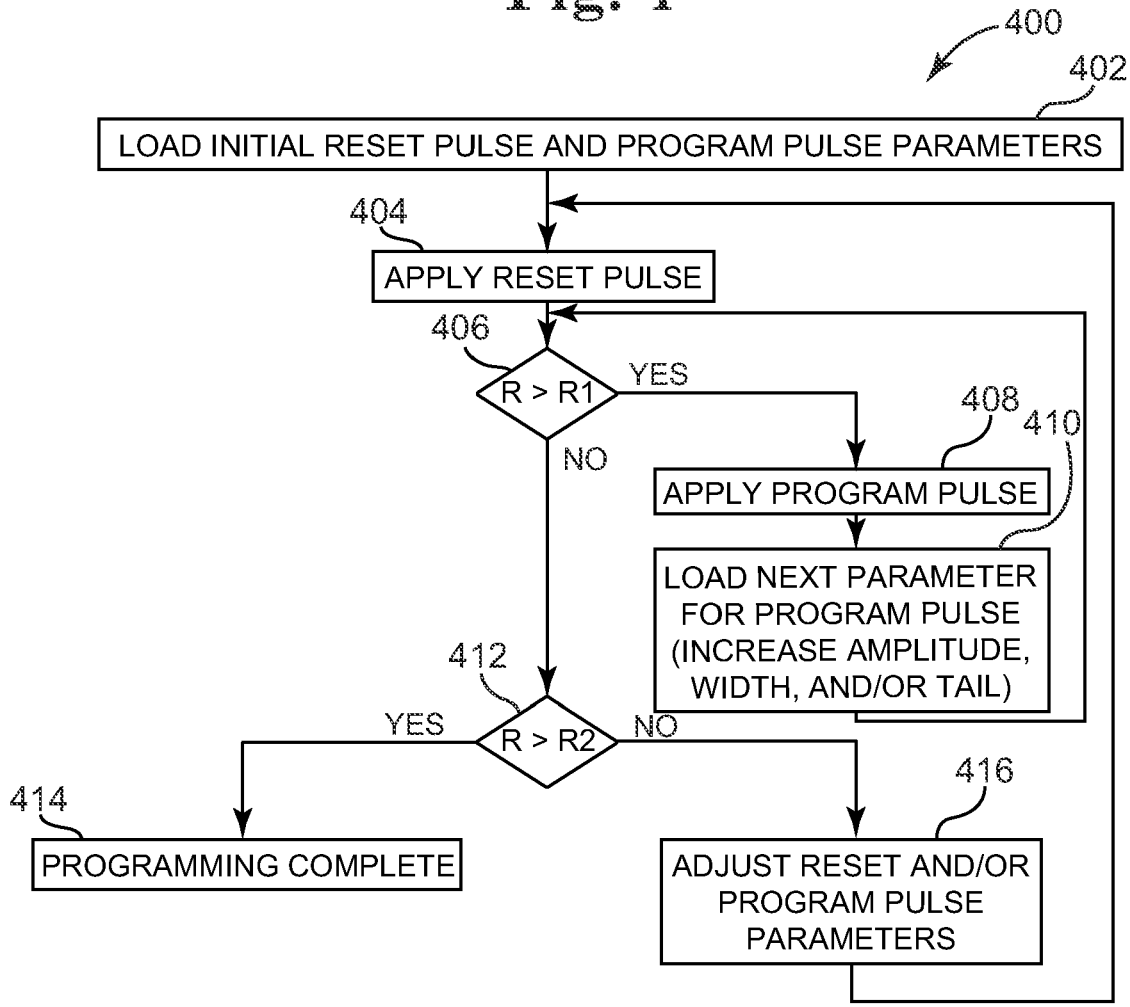
FIG. 5 is a flow diagram illustrating one embodiment of a method for programming a phase change element.

In one embodiment, to program a selected phase change element to a resistance state between resistance R1 310 and resistance R2 312, the variable program pulse includes a partial set pulse. An iterative process as described below with reference to FIG. 5 is used to program the selected phase change element to a resistance state between resistance R1 310 and resistance R2 312. The selected phase change element is programmed iteratively from the high resistance side (i.e., from above resistance R1 310) of the partial set pulse region as indicated at 314a.

FIG. 5 is a flow diagram illustrating one embodiment of a method 400 for programming a phase change element. At 402, the initial reset pulse and program pulse parameters are loaded. The initial program pulse parameters are selected such that the initial program pulse will program the phase change element to a resistance greater than resistance R1 310. At 404, the reset pulse is applied to the phase change element to reset the phase change element to the highest resistance state. At 406, the resistance (R) of the phase change element is read and the resistance is compared to resistance R1 310. If the resistance of the phase change element is greater than resistance R1 310, then at 408 the program pulse is applied to the phase change element to program the phase change element to a resistance less than the current resistance of the phase change element. At 410, the next parameter for the program pulse is loaded. The next parameter increases the amplitude, and/or width, and/or tail of the program pulse such that the next program pulse programs the phase change element to a resistance less than the current resistance of the phase change element. Control then returns to 406 where the resistance of the phase change element is again read and compared to resistance R1 310.

If the resistance of the phase change element is less than resistance R1 310, then at 412 the resistance of the phase change element is compared to resistance R2 312. If the resistance of the phase change element is greater than resistance R2 312, then at 414 programming of the phase change element is complete. If the resistance of the phase change element is less than resistance R2 312, then at 416 the reset pulse and/or program pulse parameters may be adjusted. In one embodiment, the program pulse parameters are restored to the initial conditions from 402. In another embodiment, the step size for the adjustment of the program pulse parameters at 410 is changed. In yet another embodiment, the current program pulse parameters are unchanged. Control then returns to 404 where the reset pulse is again applied to the phase change element and the process repeats. The process repeats until the resistance of the phase change element is less than resistance R1 310 and greater than resistance R2 312. If a count of the iterations reaches a predetermined value, the phase change element is considered defective and the programming process is terminated.

Figure 6:
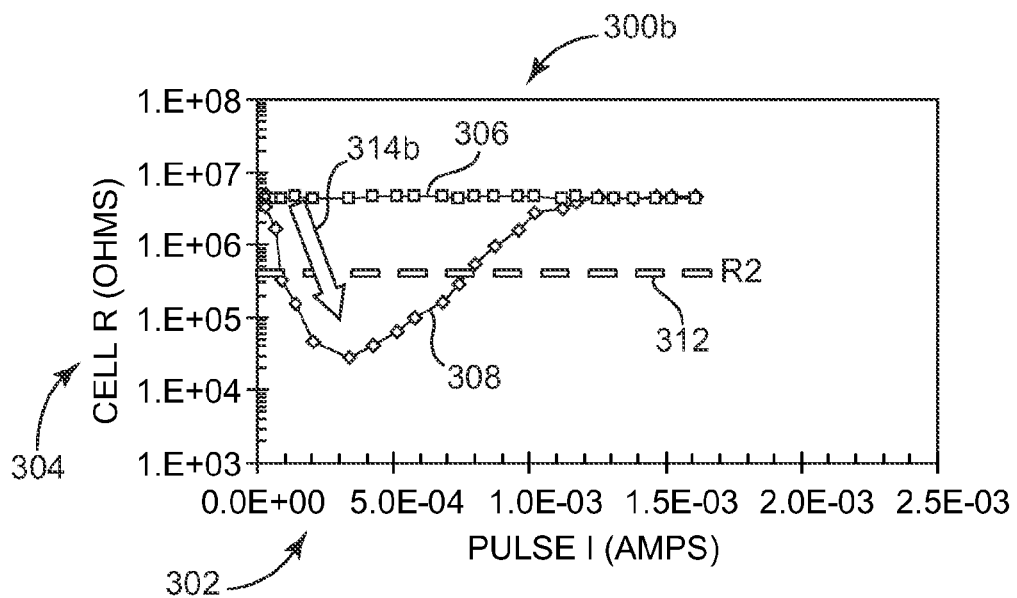
FIG. 6 is a graph illustrating another embodiment of resistance versus pulse current for programming a phase change element.
Figure 7:
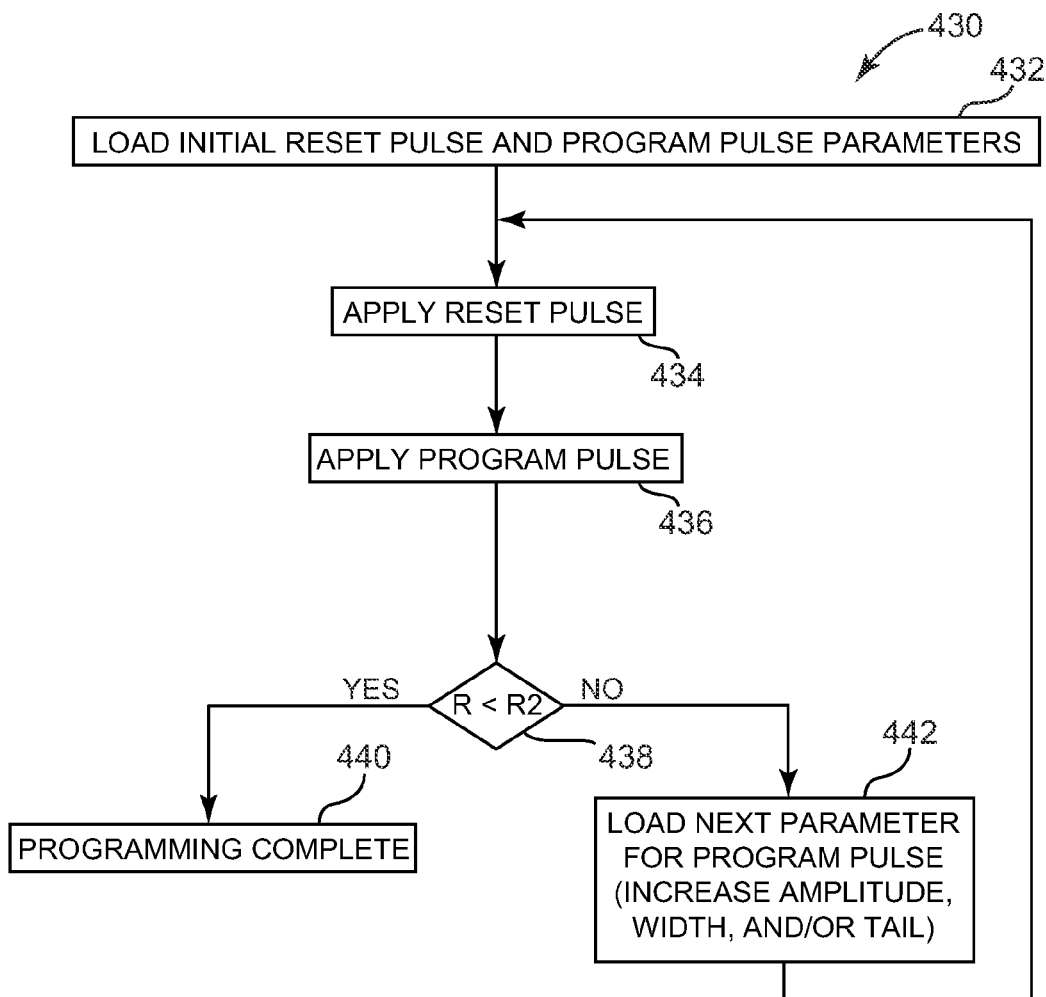
FIG. 7 is a flow diagram illustrating another embodiment of a method for programming a phase change element.

FIG. 6 is a graph 300b illustrating another embodiment of resistance versus pulse current for programming a phase change element. Graph 300b is similar to graph 300a previously described and illustrated with reference to FIG. 4, except that graph 300b includes arrow 314b and resistance R1 310 has been removed. In this embodiment, to program a selected phase change element to a resistance state just below resistance R2 312, the variable program pulse includes a partial set pulse. An iterative process as described below with reference to FIG. 7 is used to program the selected phase change element to a resistance state just below resistance R2 312. The selected phase change element is programmed iteratively from the high resistance side (i.e., from above resistance R2 312) of the partial set pulse region as indicated at 314b.

FIG. 7 is a flow diagram illustrating another embodiment of a method 430 for programming a phase change element. At 432, the initial reset pulse and program pulse parameters are loaded. The initial program pulse parameters are selected such that the initial program pulse will program the phase change element to a resistance greater than resistance R2 312. At 434, the reset pulse is applied to the phase change element to reset the phase change element to the highest resistance state. At 436, the program pulse is applied to the phase change element to program the phase change element to a resistance less than the highest resistance state.

At 438, the resistance of the phase change element is read and the resistance is compared to resistance R2 312. If the resistance of the phase change element is less than resistance R2 312, then at 440 programming of the phase change element is complete. If the resistance of the phase change element is greater than resistance R2 312, then at 442 the next parameter for the program pulse is loaded. The next parameter increases the amplitude, and/or width, and/or tail of the program pulse such that the next program pulse programs the phase change element to a resistance less than the current resistance of the phase change element. Control then returns to 434 where the reset pulse is again applied to the phase change element and the process repeats. The process repeats until the resistance of the phase change element crosses resistance R2 312, such that the resistance of the phase change element is less than resistance R2 312. If a count of the iterations reaches a predetermined value, the phase change element is considered defective and the programming process is terminated.

Figure 8:
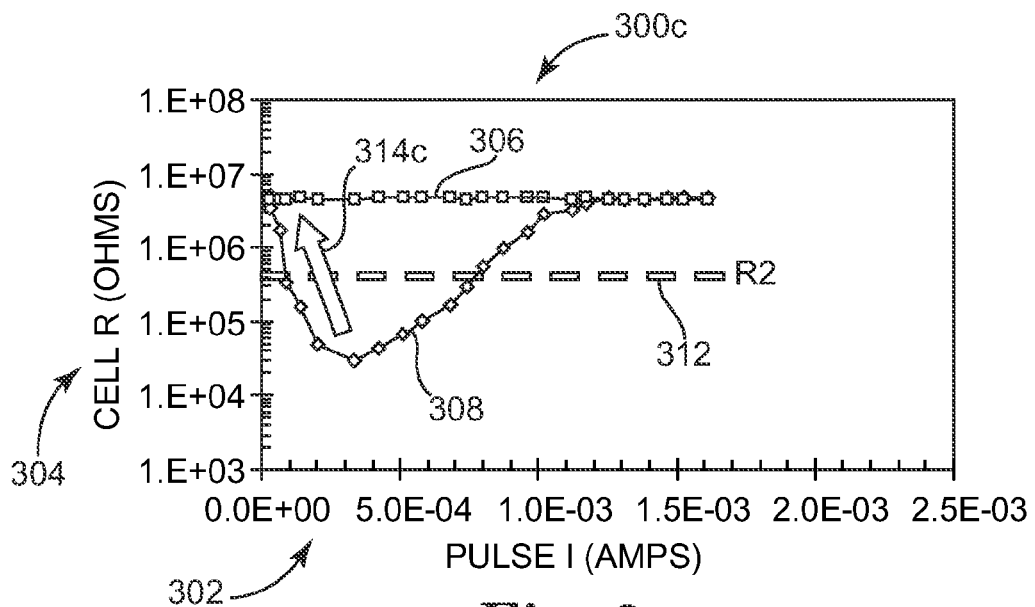
FIG. 8 is a graph illustrating another embodiment of resistance versus pulse current for programming a phase change element.
Figure 9:
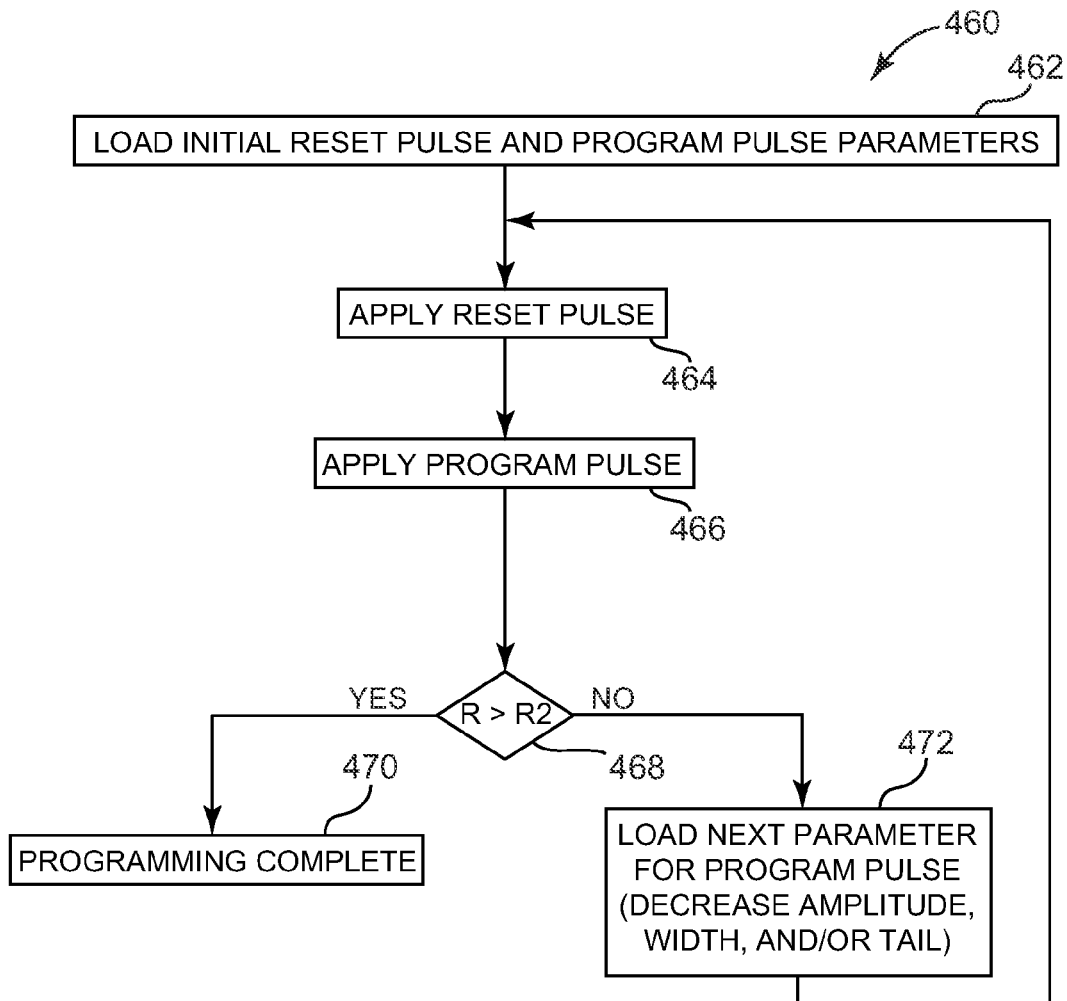
FIG. 9 is a flow diagram illustrating another embodiment of a method for programming a phase change element.

FIG. 8 is a graph 300c illustrating another embodiment of resistance versus pulse current for programming a phase change element. Graph 300c is similar to graph 300a previously described and illustrated with reference to FIG. 4, except that graph 300c includes arrow 314c and resistance R1 310 has been removed. In this embodiment, to program a selected phase change element to a resistance state just above resistance R2 312, the variable program pulse includes a partial set pulse. An iterative process as described below with reference to FIG. 9 is used to program the selected phase change element to a resistance state just above resistance R2 312. The selected phase change element is programmed iteratively from the low resistance side (i.e., from below resistance R2 312) of the partial set pulse region as indicated at 314c.

FIG. 9 is a flow diagram illustrating another embodiment of a method 460 for programming a phase change element. At 462, the initial reset pulse and program pulse parameters are loaded. The initial program pulse parameters are selected such that the initial program pulse will program the phase change element to a resistance less than resistance R2 312. In one embodiment, the initial program pulse parameters are selected such that the initial program pulse is an optimized set pulse. At 464, the reset pulse is applied to the phase change element to reset the phase change element to the highest resistance state. At 466, the program pulse is applied to the phase change element to program the phase change element to a resistance less than the highest resistance state.

At 468, the resistance of the phase change element is read and the resistance is compared to resistance R2 312. If the resistance of the phase change element is greater than resistance R2 312, then at 470 programming of the phase change element is complete. If the resistance of the phase change element is less than resistance R2 312, then at 472 the next parameter for the program pulse is loaded. The next parameter decreases the amplitude, and/or width, and/or tail of the program pulse such that the next program pulse programs the phase change element to a resistance greater than the current resistance of the phase change element. Control then returns to 464 where the reset pulse is again applied to the phase change element and the process repeats. The process repeats until the resistance of the phase change element crosses resistance R2 312, such that the resistance of the phase change element is greater than resistance R2 312. If a count of the iterations reaches a predetermined value, the phase change element is considered defective and the programming process is terminated.

Figure 10:
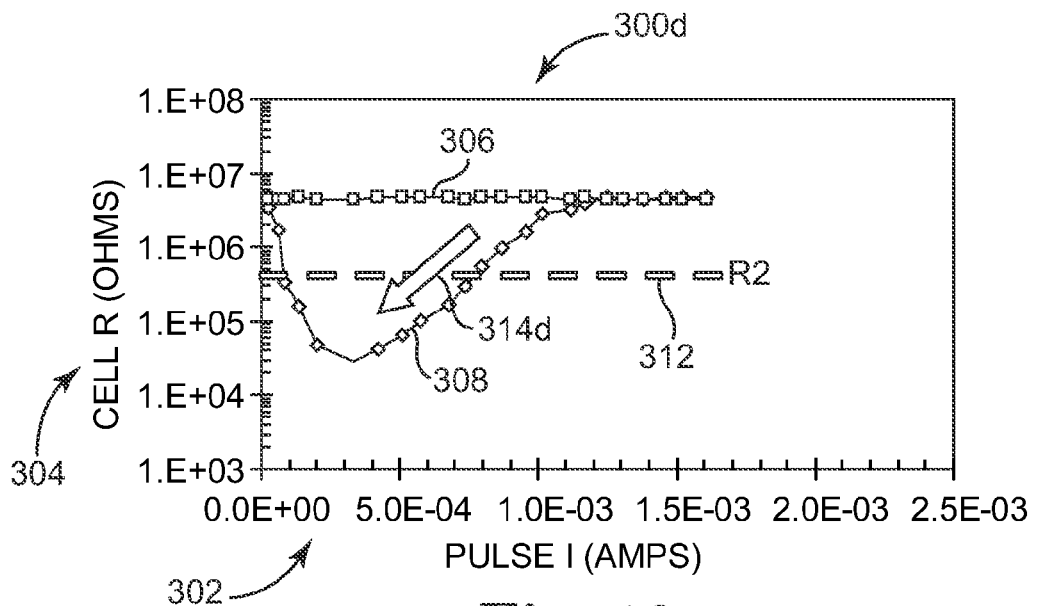
FIG. 10 is a graph illustrating another embodiment of resistance versus pulse current for programming a phase change element.
Figure 11:
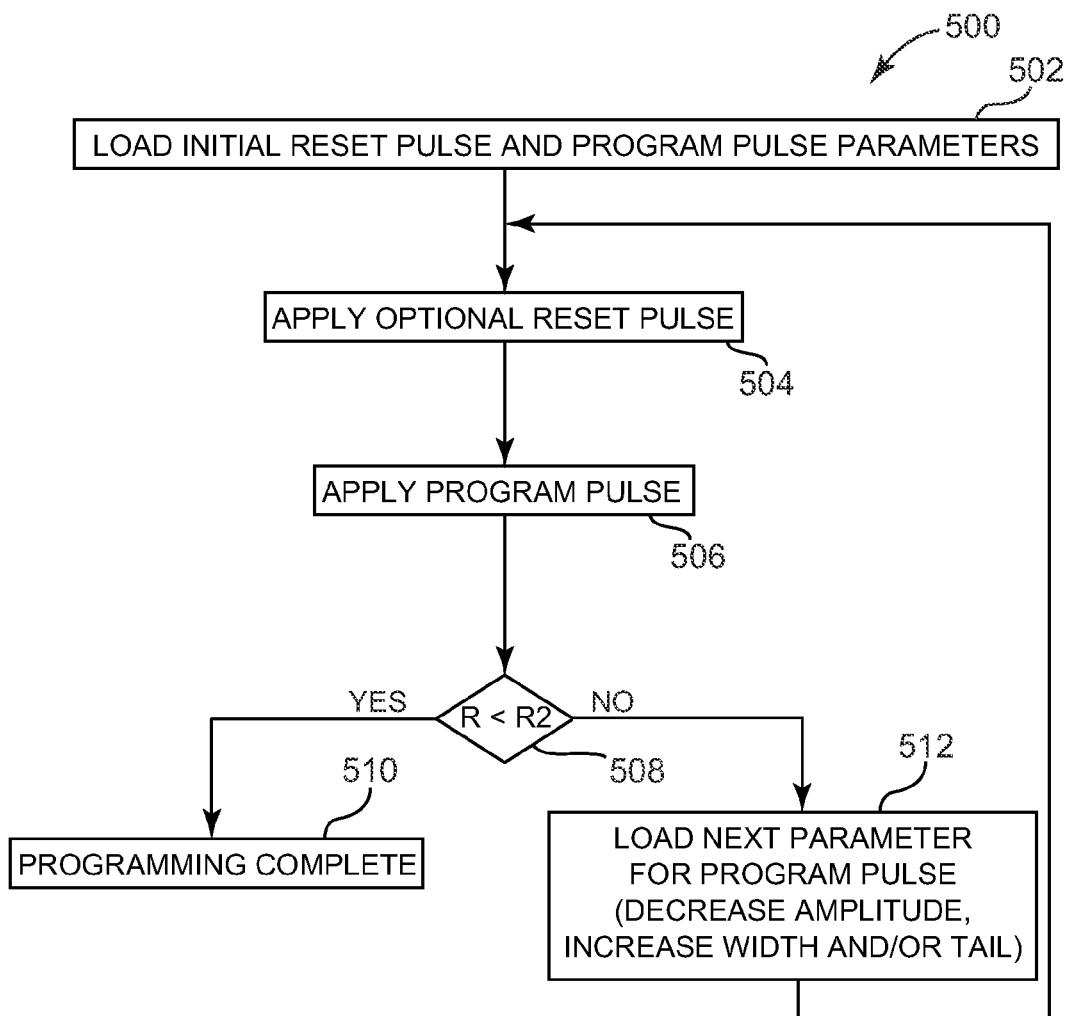
FIG. 11 is a flow diagram illustrating another embodiment of a method for programming a phase change element.

FIG. 10 is a graph 300d illustrating another embodiment of resistance versus pulse current for programming a phase change element. Graph 300d is similar to graph 300a previously described and illustrated with reference to FIG. 4, except that graph 300d includes arrow 314d and resistance R1 310 has been removed. In this embodiment, to program a selected phase change element to a resistance state just below resistance R2 312, the variable program pulse includes a partial reset pulse. An iterative process as described below with reference to FIG. 11 is used to program the selected phase change element to a resistance state just below resistance R2 312. The selected phase change element is programmed iteratively from the high resistance side (i.e., from above resistance R2 312) of the partial reset pulse region as indicated at 314d.

FIG. 11 is a flow diagram illustrating another embodiment of a method 500 for programming a phase change element. At 502, the initial reset pulse and program pulse parameters are loaded. The initial program pulse parameters are selected such that the initial program pulse will program the phase change element to a resistance greater than resistance R2 312. At 504, the reset pulse is optionally applied to the phase change element to reset the phase change element to the highest resistance state. In one embodiment, applying the reset pulse at 504 is excluded and the method proceeds from 502 directly to 506. At 506, the program pulse is applied to the phase change element to program the phase change element to a resistance less than the highest resistance state.

At 508, the resistance of the phase change element is read and the resistance is compared to resistance R2 312. If the resistance of the phase change element is less than resistance R2 312, then at 510 programming of the phase change element is complete. If the resistance of the phase change element is greater than resistance R2 312, then at 512 the next parameter for the program pulse is loaded. The next parameter decreases the amplitude, and/or increases the width, and/or increases the tail of the program pulse such that the next program pulse programs the phase change element to a resistance less than the current resistance of the phase change element. Control then returns to 504 where the reset pulse is again optionally applied to the phase change element and the process repeats. The process repeats until the resistance of the phase change element crosses resistance R2 312, such that the resistance of the phase change element is less than resistance R2 312. If a count of the iterations reaches a predetermined value, the phase change element is considered defective and the programming process is terminated.

Figure 12:
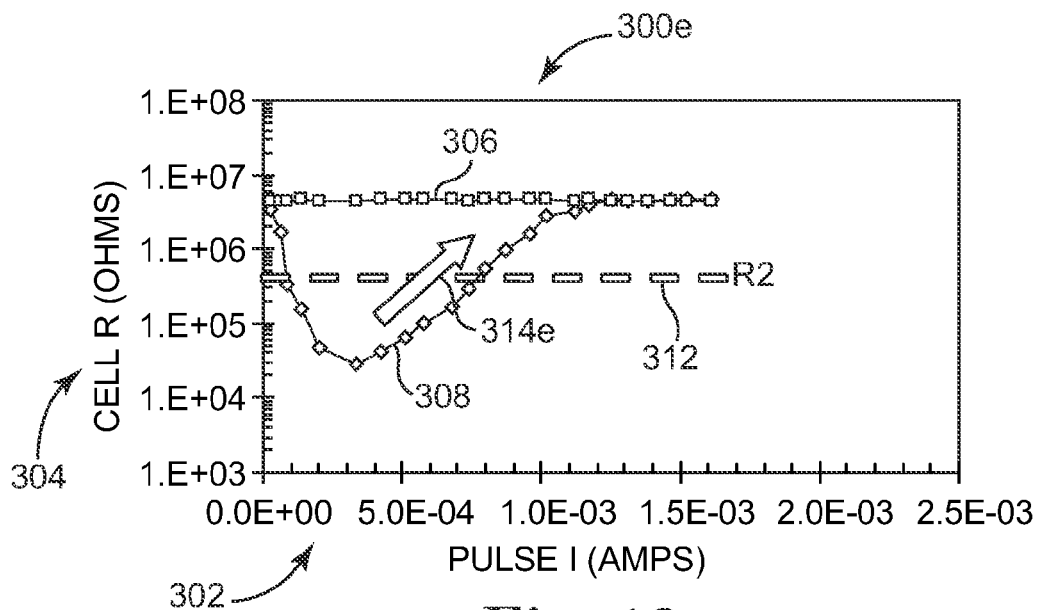
FIG. 12 is a graph illustrating another embodiment of resistance versus pulse current for programming a phase change element.
Figure 13:
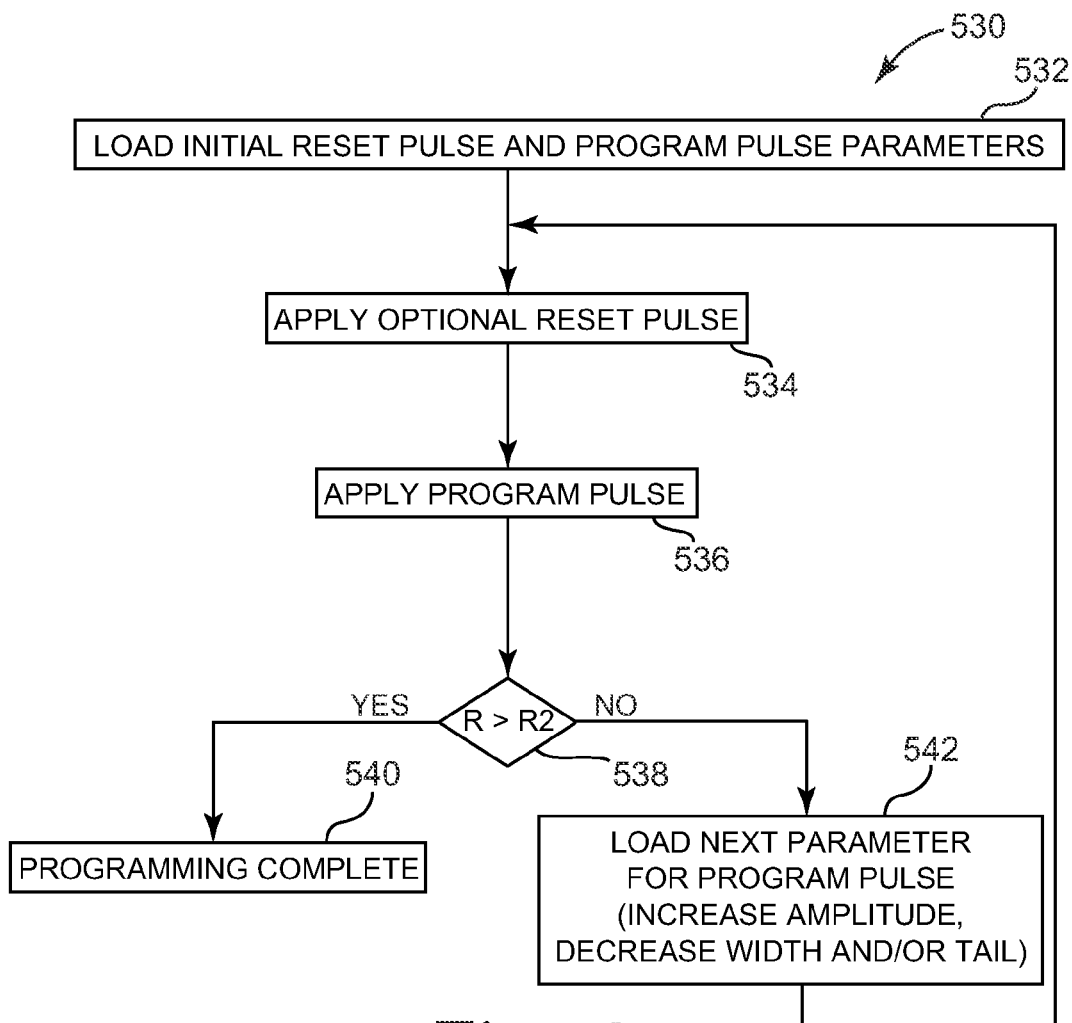
FIG. 13 is a flow diagram illustrating another embodiment of a method for programming a phase change element.

FIG. 12 is a graph 300e illustrating another embodiment of resistance versus pulse current for programming a phase change element. Graph 300e is similar to graph 300a previously described and illustrated with reference to FIG. 4, except that graph 300e includes arrow 314e and resistance R1 310 has been removed. In this embodiment, to program a selected phase change element to a resistance state just above resistance R2 312, the variable program pulse includes a partial reset pulse. An iterative process as described below with reference to FIG. 13 is used to program the selected phase change element to a resistance state just above resistance R2 312. The selected phase change element is programmed iteratively from the low resistance side (i.e., from below resistance R2 312) of the partial reset pulse region as indicated at 314e.

FIG. 13 is a flow diagram illustrating another embodiment of a method 530 for programming a phase change element. At 532, the initial reset pulse and program pulse parameters are loaded. The initial program pulse parameters are selected such that the initial program pulse will program the phase change element to a resistance less than resistance R2 312. At 534, the reset pulse is optionally applied to the phase change element to reset the phase change element to the highest resistance state. In one embodiment, applying the reset pulse at 534 is excluded and the method proceeds from 532 directly to 536. At 536, the program pulse is applied to the phase change element to program the phase change element to a resistance less than the highest resistance state.

At 538, the resistance of the phase change element is read and the resistance is compared to resistance R2 312. If the resistance of the phase change element is greater than resistance R2 312, then at 540 programming of the phase change element is complete. If the resistance of the phase change element is less than resistance R2 312, then at 542 the next parameter for the program pulse is loaded. The next parameter increases the amplitude, and/or decreases the width, and/or decreases the tail of the program pulse such that the next program pulse programs the phase change element to a resistance greater than the current resistance of the phase change element. Control then returns to 534 where the reset pulse is again optionally applied to the phase change element and the process repeats. The process repeats until the resistance of the phase change element crosses resistance R2 312, such that the resistance of the phase change element is greater than resistance R2 312. If a count of the iterations reaches a predetermined value, the phase change element is considered defective and the programming process is terminated.

Embodiments provide a method for programming phase change elements to a target resistance state. An iterative process is used to gradually approach the desired resistance state from a higher resistance or from a lower resistance. A binary comparison process is used to determine whether a phase change element is programmed to the target resistance state. Therefore, the sensed resistance of the phase change element is not converted to a digital value to implement the embodiments. Thus, embodiments reduce the time used to program the memory elements while increasing the precision of the programmed resistance compared to typical programming methods.

While the specific embodiments described herein substantially focused on using phase change memory elements, the embodiments can be applied to any suitable type of resistance or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a resistance changing memory element; and
a circuit configured to program the memory element by iteratively applying a reset pulse followed by a variable program pulse to the memory element until a resistance of the memory element crosses a first reference resistance, the variable program pulse adjusted for each iteration such that the resistance of the memory element approaches the first reference resistance, and the reset pulse for each iteration programming the memory element to a substantially amorphous state prior to each variable program pulse.

2. The integrated circuit of claim 1, wherein the circuit is configured to program the memory element by iteratively applying the reset pulse followed by a variable partial set program pulse to the memory element until the resistance of the memory element is less than the first reference resistance.

3. The integrated circuit of claim 1, wherein the circuit is configured to program the memory element by iteratively applying the reset pulse followed by a variable partial set program pulse to the memory element until the resistance of the memory element is less than the first reference resistance and greater than a second reference resistance.

4. The integrated circuit of claim 1, wherein the circuit is configured to program the memory element by iteratively applying the reset pulse followed by a variable partial set program pulse to the memory element until the resistance of the memory element is greater than the first reference resistance.

5. The integrated circuit of claim 1, wherein the circuit is configured to program the memory element by iteratively applying the reset pulse followed by a variable partial reset program pulse to the memory element until the resistance of the memory element is less than the first reference resistance.

6. The integrated circuit of claim 1, wherein the circuit is configured to program the memory element by iteratively applying the reset pulse followed by a variable partial reset program pulse to the memory element until the resistance of the memory element is greater than the first reference resistance.

7. The integrated circuit of claim 1, wherein the circuit comprises a counter configured to count the iterations and terminate programming of the memory element in response to the count reaching a predetermined value.

8. The integrated circuit of claim 1, wherein the resistance changing memory element comprises a phase change memory element.

9. A system comprising:
a host; and
a memory device communicatively coupled to the host, the memory device comprising:
  a phase change memory element;
  a write circuit configured to program the memory element by iteratively applying a variable program pulse to the memory element until a resistance of the memory element crosses a reference resistance, the variable program pulse adjusted for each iteration such that the resistance of the memory element approaches the reference resistance; and
  a counter configured to count the iterations and terminate programming of the memory element in response to the count reaching a predetermined value.

10. The system of claim 9, wherein the write circuit is configured to apply a reset pulse before each variable program pulse.

11. The system of claim 10, wherein the write circuit is configured to program the memoiy element by iteratively applying a variable partial set pulse to the memory element until the resistance of the memory element is less than the reference resistance.

12. The system of claim 10, wherein the write circuit is configured to program the memory element by iteratively applying a variable partial set pulse to the memory element until the resistance of the memory element is greater than the reference resistance.

13. The system of claim 10, wherein the write circuit is configured to program the memory element by iteratively applying a variable partial reset pulse to the memory element until the resistance of the memory element is less than the reference resistance.

14. The system of claim 10, wherein the write circuit is configured to program the memory element by iteratively applying a variable partial reset pulse to the memory element until the resistance of the memory element is greater than the reference resistance.

15. The system of claim 9, wherein the memory device further comprises:
a sense circuit configured to read the resistance of the memory element; and
a controller configured to control the write circuit and the sense circuit.

16. A method for programming a memory element, the method comprising:
iteratively applying a reset pulse to the memory element to program the memory element to a substantially amorphous state followed by applying a variable program pulse to the memory element, reading a resistance of the memory element, and comparing the read resistance to a reference resistance until the read resistance crosses the reference resistance; and
adjusting the variable program pulse for each iteration such that the resistance of the memory element approaches the reference resistance.

17. The method of claim 16, wherein iteratively applying the reset pulse followed by the variable program pulse to the memory element, reading the resistance of the memory element, and comparing the read resistance to the reference resistance comprises iteratively applying the reset pulse followed by a variable partial set program pulse to the memory element, reading the resistance of the memory element, and comparing the read resistance to the reference resistance until the read resistance is less than the reference resistance.

18. The method of claim 16, wherein iteratively applying the reset pulse followed by the variable program pulse to the memory element, reading the resistance of the memory element, and comparing the read resistance to the reference resistance comprises iteratively applying the reset pulse followed by a variable partial set program pulse to the memory element, reading the resistance of the memory element, and comparing the read resistance to the reference resistance until the read resistance is greater than the reference resistance.

19. The method of claim 16, wherein iteratively applying the reset pulse followed by the variable program pulse to the memory element, reading the resistance of the memory element, and comparing the read resistance to the reference resistance comprises iteratively applying the reset pulse followed by a variable partial reset program pulse to the memory element, reading the resistance of the memory element, and comparing the read resistance to the reference resistance until the read resistance is less titan the reference resistance.

20. The method of claim 16, wherein iteratively applying the reset pulse followed by the variable program pulse to the memory element, reading the resistance of the memory element, and comparing the read resistance to the reference resistance comprises iteratively applying the reset pulse followed by a variable partial reset program pulse to the memory element, reading the resistance of the memory element, and comparing the read resistance to the reference resistance until the read resistance is greater than the reference resistance.

21. The method of claim 16, further comprising:
counting the number of iterations; and
terminating the iterations in response to a count of the counter reaching a predetermined value.

22. The method of claim 16, wherein iteratively applying the program pulse comprises iteratively applying the program pulse to a phase change memory element.

* * * * *